United States Patent
Waite et al.

(10) Patent No.: US 8,379,403 B2
(45) Date of Patent: Feb. 19, 2013

(54) SPACER-CONNECTOR AND CIRCUIT BOARD ASSEMBLY

(75) Inventors: David W. Waite, Oceanside, CA (US);
James L. Blair, Ramona, CA (US);
Ashish Lohiya, La Jolla, CA (US);
Arvid G. Sammuli, Escondido, CA (US); Jeffrey T. Smith, Poway, CA (US); Saritha Narra, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 351 days.

(21) Appl. No.: 12/750,458

(22) Filed: Mar. 30, 2010

(65) Prior Publication Data

US 2010/0255690 A1 Oct. 7, 2010

Related U.S. Application Data

(60) Provisional application No. 61/166,112, filed on Apr. 2, 2009.

(51) Int. Cl.
*H05K 7/00* (2006.01)

(52) U.S. Cl. ........ 361/777; 361/715; 361/734; 361/763; 361/785; 361/809; 257/726; 257/727; 324/756.05; 324/762.02; 439/65

(58) Field of Classification Search .................. 361/777, 361/715, 734, 763, 785, 809; 257/726, 727; 324/756.02, 756.05, 762.02; 439/65
See application file for complete search history.

(56) References Cited

U.S. PATENT DOCUMENTS

| | | | | |
|---|---|---|---|---|
| 5,229,917 A * | 7/1993 | Harris et al. | ........... | 361/715 |
| 5,309,324 A * | 5/1994 | Herandez et al. | ........... | 361/734 |
| 5,334,029 A * | 8/1994 | Akkapeddi et al. | ........... | 439/66 |
| 5,793,618 A * | 8/1998 | Chan et al. | ........... | 361/809 |
| 5,890,915 A | 4/1999 | Reylek | | |
| 6,462,570 B1 * | 10/2002 | Price et al. | ........... | 324/756.02 |
| 2002/0130653 A1 | 9/2002 | Frame | | |
| 2008/0093112 A1 | 4/2008 | Kushta | | |
| 2009/0133913 A1 | 5/2009 | Kushta et al. | | |
| 2010/0244871 A1 * | 9/2010 | Blair et al. | ........... | 324/755 |

FOREIGN PATENT DOCUMENTS

| | | |
|---|---|---|
| DE | 102004030077 A1 | 10/2005 |
| DE | 102006003584 A1 | 12/2006 |
| WO | WO2007046271 A1 | 4/2007 |
| WO | WO2008117213 A2 | 10/2008 |

OTHER PUBLICATIONS

International Search Report and Written Opinion—PCT/US2010/029861, International Search Authority—European Patent Office—Dec. 6, 2010.

* cited by examiner

*Primary Examiner* — Xiaoliang Chen
(74) *Attorney, Agent, or Firm* — William M. Hooks

(57) ABSTRACT

A spacer-connector and connection arrangements between daughter boards and motherboards are disclosed. Assemblies may include a daughter board one or more spacer-connectors spacing the daughter board above a motherboard and conductive elastomers providing electrical connections between the daughter board and spacer-connector and between the spacer-connector and the motherboard. The spacer-connector may include ground, power, digital and/or controlled impedance RF pathways to conduct signals between the daughter board to the mother board.

19 Claims, 10 Drawing Sheets

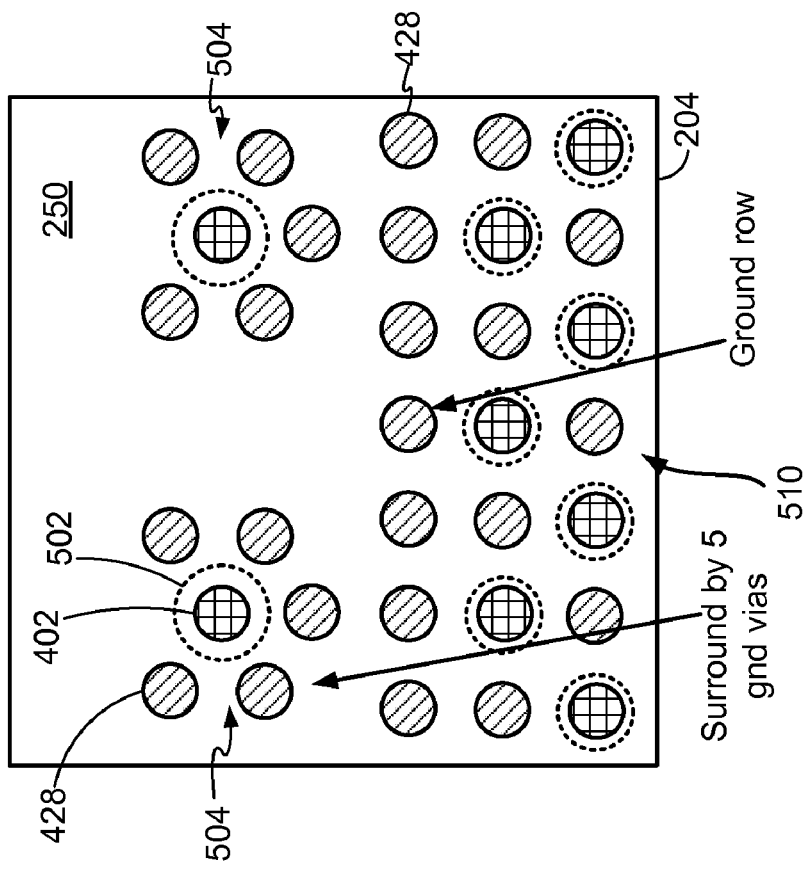
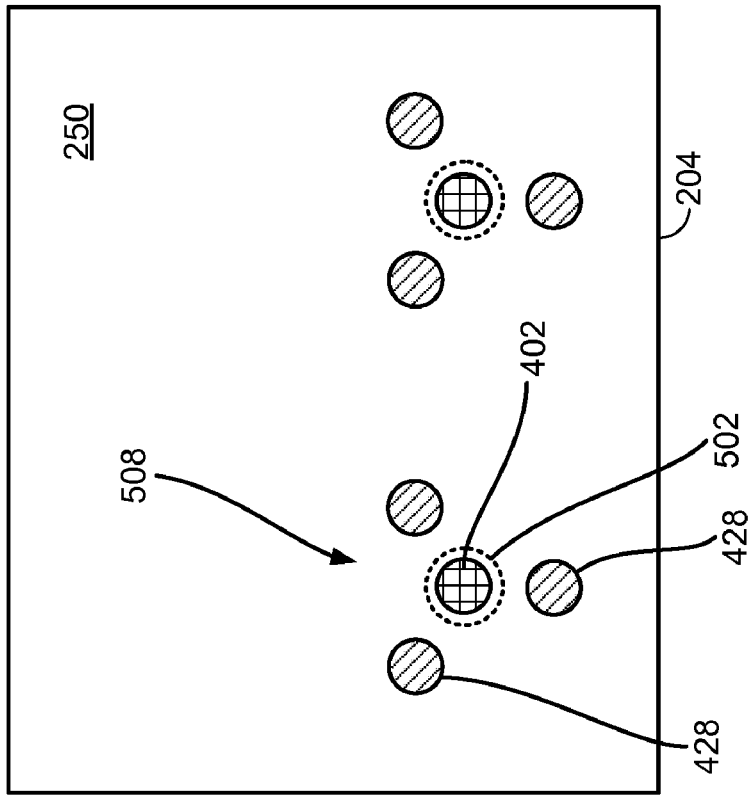
FIG. 5B
FIG. 5A

SPACER-CONNECTOR AND CIRCUIT BOARD ASSEMBLY

CLAIM OF PRIORITY UNDER 35 U.S.C.§119

The present application for patent claims priority to Provisional Application No. 61/166,112 entitled "DAUGHTER BOARD, CONNECTOR AND PRINTED CIRCUIT BOARD ASSEMBLY" filed Apr. 2, 2009, and assigned to the assignee hereof and hereby expressly incorporated by reference herein.

FIELD OF DISCLOSURE

Embodiments of the invention are related spacer/connector interfaces between daughter boards connected to printed circuit boards and test equipment interfaces.

BACKGROUND

Printed circuit boards (PCBs) are the means of choice to interconnect a wide variety of electronic circuits and associated components into electronic or electro-mechanical assemblies capable of performing a nearly unlimited number of tasks ranging from ultra miniature surveillance devices to mainframe supercomputers. The PCB assemblies can range in size from several square millimeters to a square meter and beyond. An art form in PCB manufacturing is to reliably produce fine-pitched circuits of conductor material (typically copper; Cu) on physically large circuit boards such as 0.5 mm component pad spacing on a 32-layer 18"×24" PCB; a feat presently attainable by only a select few PCB fabricators worldwide. This feat becomes nearly unattainable at a component pad spacing of 0.4 mm and smaller. Greatly facilitating sub 0.5 mm circuit geometries (e.g., device-under-test (DUT) pin-to-pin pitch) is the allowance of smaller/thinner PCBs.

Unfortunately, a small circuit board will rarely hold a large amount of circuitry. Further, the physically large circuit boards (e.g., load boards), which can hold a large amounts of circuitry and interfaces are expensive and may be an interface to complex equipment. In particular, in a test environment load boards may be used to interface to complex digital and analog signal analysis and test equipment.

For example, referring to FIG. 1, using the current technology as discussed above, in that a load board (or mother board) 100 has a socket 110 that mounts directly to mother board 100 using fasteners 112. A device under test (DUT) 115 having a certain ball grid array (BGA) spacing (e.g., 0.5 mm BGA) is mounted in the socket 110. Load board DUT and support electronics signals may be conveyed to off-board host instrumentation through various connector means 118 including spring loaded bed-of-nails pin arrays. The mother board may be substantially larger than the socket 110/DUT 115 (e.g., a 32-layer 18"×24" PCB, as noted above). Although the mother board 100 can be physically large, the trace widths have to scale to match the spacing of the DUT 115 (e.g., 0.5 mm), at least in the mounting area of the DUT 115. However, as the BGA spacing gets smaller in newer components, the large mother boards 100 cannot scale to these smaller spacing requirements.

Additionally, the configuration of FIG. 1 has limited space for tuning components that are used for high frequency (e.g., RF) connections or other components requiring close DUT proximity. Accordingly, conventional direct mounted DUT/ mother board configurations would also require complex and numerous board mounted connectors to obtain the RF signals off the DUT.

SUMMARY

Exemplary embodiments of the invention are directed to systems and method for daughter boards connected to printed circuit boards.

Accordingly, an embodiment can include a circuit board assembly comprising: a spacer-connector assembly positioned between a first circuit board and a second circuit board, wherein the spacer-connector assembly comprises: a spacer-connector formed of a multilayer printed circuit board (PCB) having a configurable pad array that is configured to pass signals between the first circuit board and the second circuit board, wherein the pad array is formed from the surface conductive layer of the PCB; and elastomeric conductive interface positioned between the pad array of each of the spacer-connector the first circuit board and second circuit board. The circuit board assembly can further include a pressure component configured to provide a homogeneous pressure across the elastomeric conductive interface of the spacer-connector assembly.

Another embodiment can include a spacer-connector formed of a multilayer printed circuit board (PCB) comprising: a configurable pad array that is configured to pass signals between a first surface of the PCB and a second surface of the PCB, wherein the pad array is formed from a surface conductive layer of the PCB on respective first and second surfaces; and a plurality of conductive vias formed through the PCB, wherein the PCB includes multiple parallel ground planes.

Another embodiment can include a spacer-connector formed of a multilayer printed circuit board (PCB) comprising contact means for passing signals from a first surface of the PCB to a second surface of the PCB, wherein the contact means is formed from a surface conductive layer of the PCB on respective first and second surfaces; and a conductive means for conducting signals formed through the PCB, wherein the PCB includes multiple parallel ground planes.

BRIEF DESCRIPTION OF THE DRAWINGS

The accompanying drawings are presented to aid in the description of embodiments of the invention and are provided solely for illustration of the embodiments and not limitation thereof.

FIGS. 5A-5D are top plan views of via arrangements on a surface of a connector according to embodiments disclosed herein.

DETAILED DESCRIPTION

Figure 1:
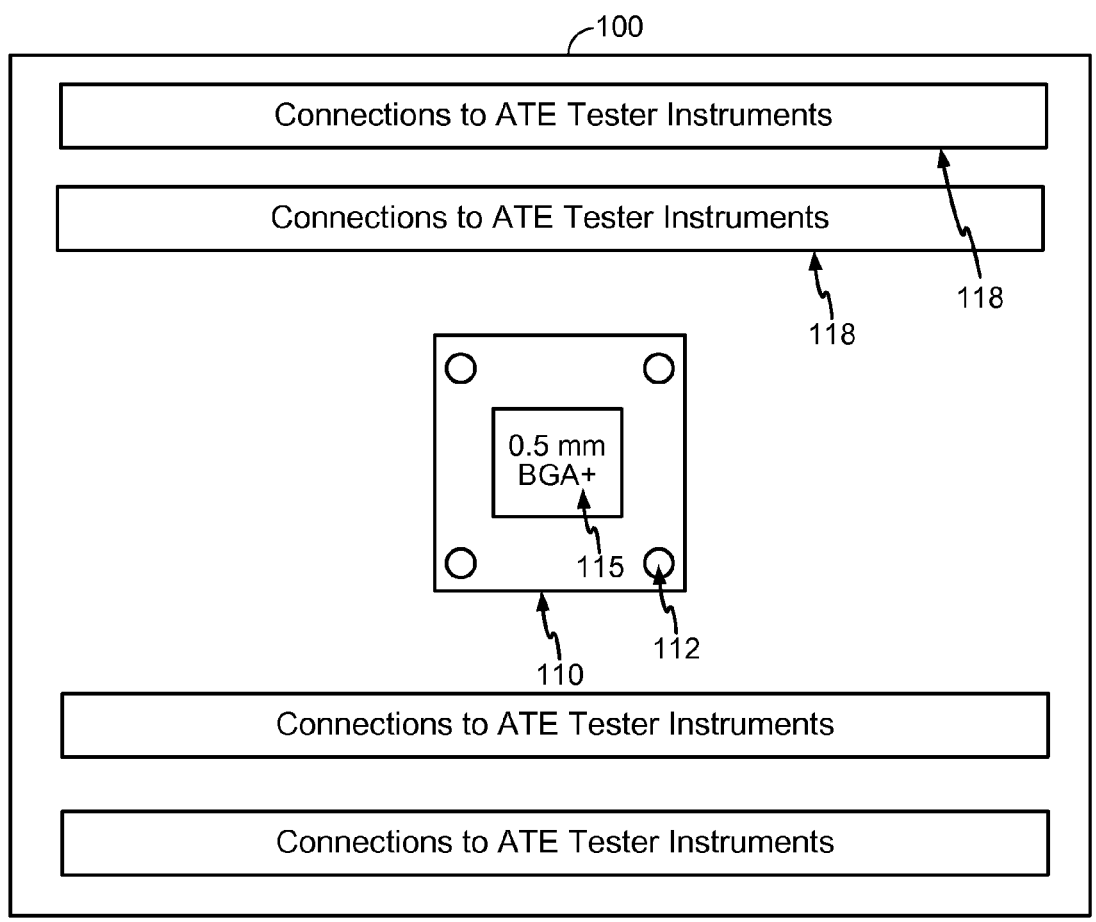
FIG. 1 is a plan view of a conventional arrangement of a socket, device under test, and mother board.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

In the illustrated and discussed embodiments provided herein, some dimensional information may be provided to give a reference to the scale and relative sizes of elements in various embodiments. However, these examples and illustrations are provided solely to facilitate discussion and understanding of embodiments of the invention and are not to be construed as limiting embodiments of the invention to the disclosed dimensions, scale, and/or relative sizes of elements.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 2A:
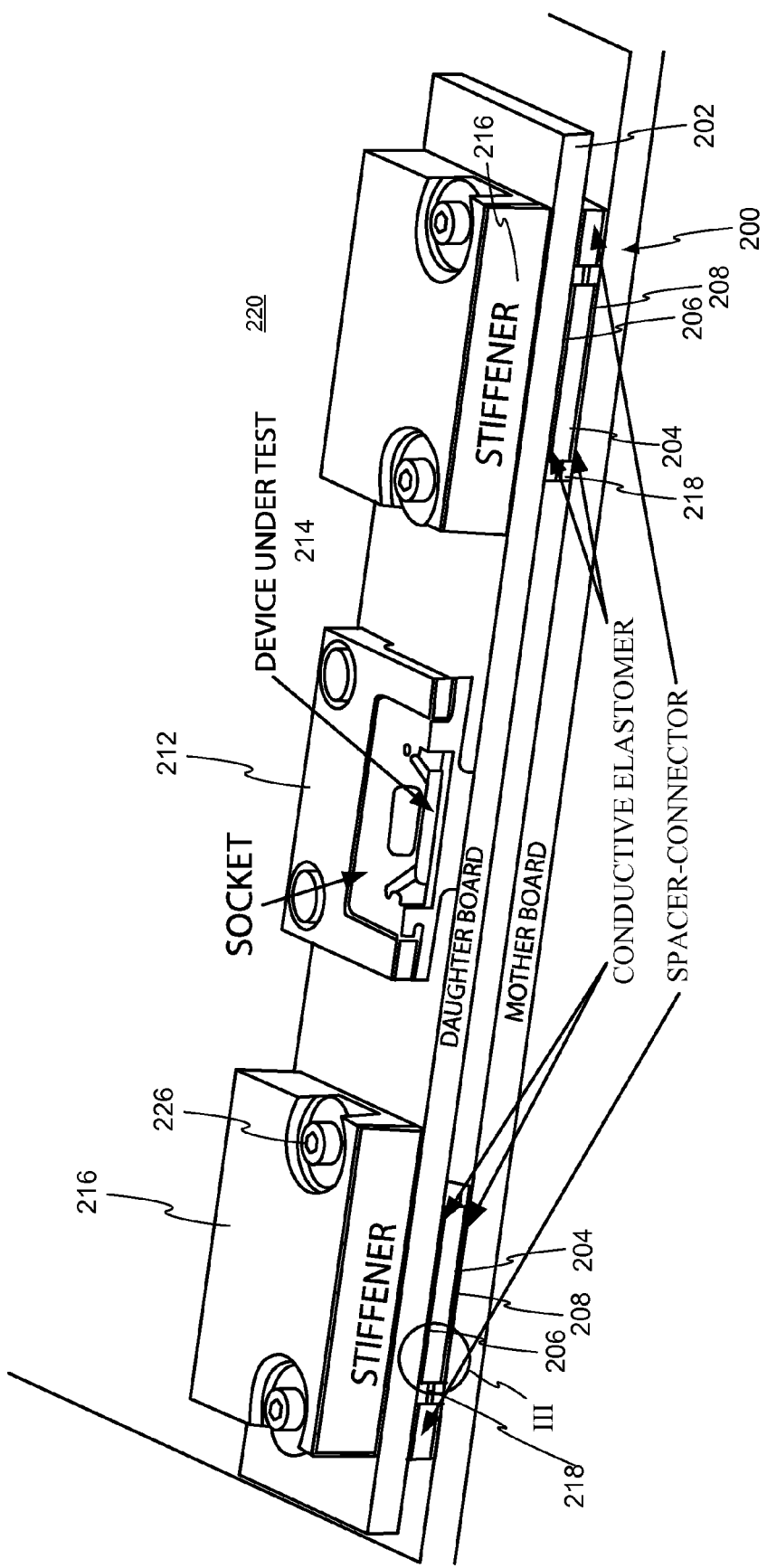
FIG. 2A is a sectional perspective view of an assembly including a socket, a device under test, a daughter board, a spacer-connector, framed conductive elastomer stiffeners and a mother board.

FIG. 2A illustrates a motherboard 200 on which a daughter board 202 is mounted. Daughter board 202 is supported on the motherboard 200 by first and second spacer-connectors 204 which connectors 204 include conductive pathways discussed hereinafter. A first conductive elastomer 206 provides an electrical connection between the daughter board 202 and the spacer-connectors 204, and a second conductive elastomer 208 provides an electrical connection between the motherboard 200 and the spacer-connector assembly 204.

Figure 3:
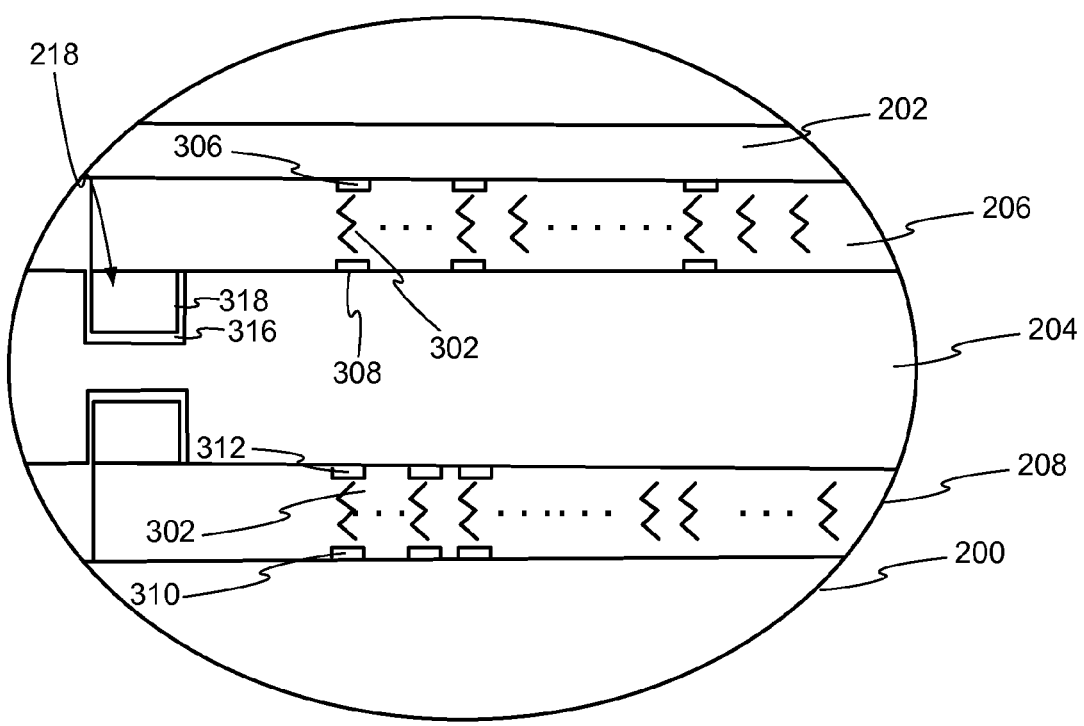
FIG. 3 is a detail view of circle III in FIG. 2A illustrating an example of elastomer properties and geometries.

As illustrated in FIG. 3, the first and second conductive elastomers 206, 208 each include vertically coupled conductive elements 302 in a high density grid that provide high quality coupling (e.g., low parasitic (e.g., resistance, capacitance, inductance), low noise and cross-talk, wide band) path. As used herein, the conductive elements 302 may include wires, balls, spheres, cubes, segments, particles, and the like, that can be utilized as a conductive path. Lower contact pads 306 of the daughter board 202 are coupled to upper contact pads 308 of the first spacer-connector 204, through the multiple conductive elements 302 of the first conductive elastomer 206. Similarly, upper contact pads 310 of the motherboard 200 are coupled to lower spacer contact pads 312 of the first connector 204 through the conductive elements 302 of the second conductive elastomer 208. These connections using the first and second conductive elastomers 206, 208 do not require any soldering or other permanent connection techniques. Further, precise alignment of the conductive elements 302 is also not required as the high density grid is configured to provide multiple vertical conductive paths between the tops and bottoms of the conductive elastomers. The sheet style conductive elastomers can be secured by frame elements 218 including frame 318 and frame well 316. For example, frame well 316 can be formed in the surfaces of the spacer-connector 204 to receive a frame 318, which can be glued to the sheet elastomer 206, 208 to apply a requisite tension. The frame 316 can be snap fit, glued or otherwise secured in the frame well to secure the sheet style conductive elastomer 206, 208 over the contact pads 308, 312.

As will be appreciated, using the first and second conductive elastomers 206, 208 to couple the daughter board 202 to the motherboard 200 facilitates changing of the daughter board 202, which can be very useful in production test environments or prototyping applications, for example. The conductive elastomer may be in a sheet form, a spray-on material, or any other similar high density conductive compressible material that becomes conductive in vertical paths under pressure.

Although the first and second conductive elastomers 206, 208 having vertically coupled conductive elements 302 are disclosed and discussed herein, embodiments of the invention are not limited to this configuration. Other conductive elements, such as, spray-on, jelly, paste, or wire mesh conductive mediums, spring pins, and other conductive polymers can be used. Furthermore, while the conductive elastomers 206 and 208 provide certain benefits, in some embodiments it may be desirable to couple the connector (or pad array) of spacer-connector 204 to the motherboard 200 and/or to the daughter board 202 with solder or ultrasonic welds or to provide, for example, spring or formed pin type connectors between the daughter board 202 and the connector of spacer-connector 204. In general, conductive elastomer (e.g., 206, 208) may also be referred to as elastomeric conductive interface. The elastomeric conductive interface may be formed of a material that is conductive under a characteristic pressure. The characteristic pressure may include a range of pressures at which the elastomeric conductive interface 206, 208 is conductive. Further, it will be appreciated that the characteristic pressure may vary per material used and application.

Referring again to FIG. 2A, the daughter board 202 includes a socket 212 into which a DUT 214 may be inserted to electrically couple the DUT 214 electrical pin-contacts to the daughter board 202. The daughter board 202 includes a plurality of electrical connections between various electrical contacts (not illustrated) of the socket 212 and daughter board lower contact pads (shown in FIG. 3). If the electrical contacts of DUT 214 have a small pitch, such as 0.4 mm for example, it can be difficult to electrically connect these pin-contacts to connectors immediately beneath the socket 212. In the present embodiment, electrical connections in the daughter board 202 extend to both the left and to the right of the socket 212 as viewed in FIG. 2A toward the daughter board lower contact pad 306 near the first and second connectors of spacer-connector 204. The daughter board lower contact pads can have a pitch greater than the pitch of the pin-contacts of the DUT 214, and this facilitates connections with the DUT 214. Other embodiments may include more than two connectors of spacer-connector 204 arranged around socket 212 to provide a larger area for connections between the DUT 214 and the motherboard 200.

The assembly of the motherboard 200, the first and second conductive elastomers 206, 208 and the connectors of spacer-connector 204 are compressed to from the conductive elements in the first and second conductive elastomers 206, 208 into conductive pathways. Stiffener blocks 216 may be provided to keep an even amount of pressure over the spacer-connectors 204 and to maintain good electrical connections between the first and second conductive elastomers 206, 208 and the connectors of spacer-connector 204. As noted, stiffener 216 generally can be considered a pressure component configured to provide a homogeneous pressure across the elastomeric conductive interface 206 of the spacer-connector assembly (e.g., 204 and 206). As illustrated, a stiffener block 216 can be located over the spacer-connector 204 and coupled to the daughter card 202 and mother board 200. The stiffener block 216 can be formed of metal with the surface contacting the daughter card being insulated. Alternatively, the rigid element of the stiffener block 216 can be formed of any suitable conducting or non-conducting material. The stiffener block 216 may include a grounded metal insert to provide electrical shielding and/or eliminate induced current, antennae effect, etc. Additionally, sensors (e.g., pressure transducer, strain gauge, etc.) can be embedded in stiffener 216 to measure pressure and confirm the pressure is uniform. Further, in alternative embodiments, the stiffener 216 surfaces do not have to be parallel to spacer-connector 204 and may be radiused to apply more pressure in center. Still further, the hold down 226 for the stiffener 216 can be gimballed.

The stiffener block 216 may be coupled to the daughter card and mother board via a resilient fastener system 226. The fastener system may include for example a bolt and spring washer, or any other device to provide a relatively constant pressure over a suitable compliance range. Further, in an alternative embodiment, the pressure component may be a resilient fastener system directly applied to the daughter card 202 to fasten the daughter card 202 to the mother board 200 and compress the spacer-connector assembly (204, 206) in between with a relatively constant pressure.

Frame elements 218 (including frame well 316 and frame 318, illustrated in FIG. 3) may be included to help provide mechanical support and/or tension in the case of sheet type conductive elastomers 206, 208. The frame elements 218 can be fit or fastened to the motherboard 200 and/or the daughter board 202. As illustrated in FIG. 2A, the first and second conductive elastomers 206, 208 are sheet type and as such the frame elements 218 and conductive elastomers 206, 208 do not have to register to either the daughter board 202 or the motherboard 200. In one embodiment, the frame elements 218 may be coupled to a recessed portion of the daughter board 202 to allow for reduced assembly stack height. Further, the high density conductive grid of the conductive elastomers 206, 208 can accommodate misalignment of opposing mating surface pads. The density of the conductive elastomer conductive elements is chosen to ensure that a requisite number of elements make contact to a sustentative portion of each of the related pads.

When the device under test 214 includes RF components, it may be desirable to place RF tuning circuitry and RF-related components close to the device under test to reduce the effects of the pathway between the DUT 214 and such circuitry. For example, if RF traces are routed at appreciable length on a PCB the signal integrity (fidelity) of these electrical pathways will suffer due to insertion and return loss effects attributable in part to loss of impedance control due to the presence of parasitic (stray) inductance and/or capacitance or conductor skin effect losses. It would therefore be desirable to keep RF components at a controllable, small distance from the DUT 214. One way of providing more usable real estate near the DUT 214 is to elevate the DUT 214 and daughter board 202 above the motherboard using spacer-connector 204 as described above. As used herein the term PCB can be any form of multilayer laminated, cast or molded circuit board component.

Figure 2B:
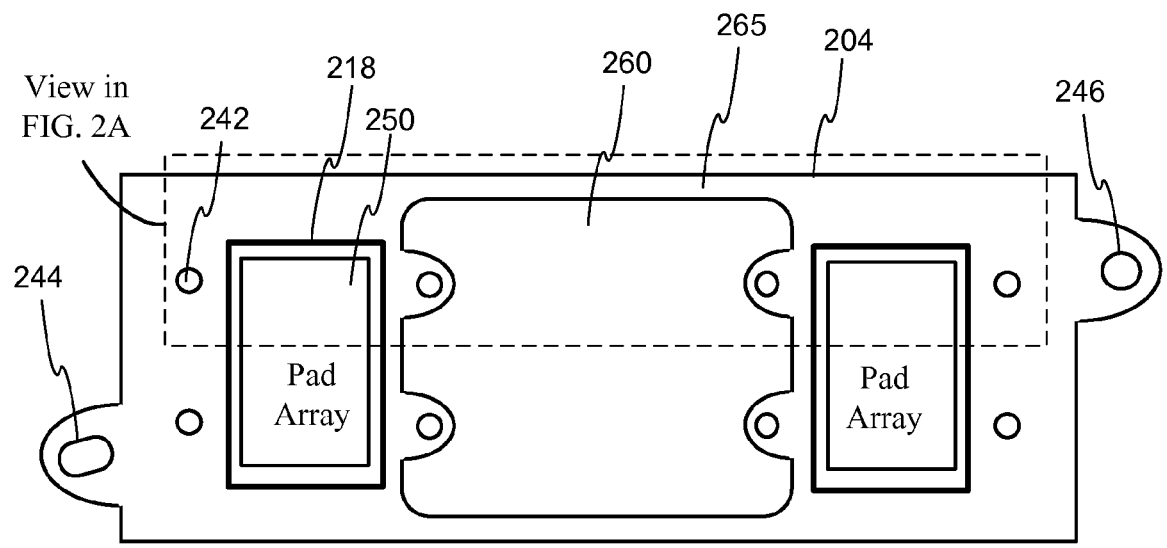
FIG. 2B-2C illustrated plan view configurations for the spacer/connector.

FIG. 2B illustrates a plan view of the spacer-connector 204. A portion illustrated in FIG. 2A is enclosed within the dashed area. As can be seen from the plan view, the spacer-connector has two pad arrays 250 (or connectors) with frame elements 218 (including frame 318 and frame well 316 in FIG. 3) disposed around the pad array 250. An open area or cavity 260 may provide for access to the underside of the DUT as illustrated in FIG. 2A. The cavity 260 can be located between the pad arrays 250 and may be enclosed by a thin web of material 265. Each pad array has a plurality of mounting holes 242 (e.g., four as illustrated) that allow for the stiffener to be coupled to the board assembly. In addition to the mounting hardware it will be appreciated that alignment mechanisms can be used to ensure proper alignment with respect to the pad arrays (250). Accordingly, first hole 246 and a second hole 244, which may be slotted and aligned with the centerline of the first hole 246, can be used to provide alignment and registration for the spacer-connector 204.

Figure 2C:
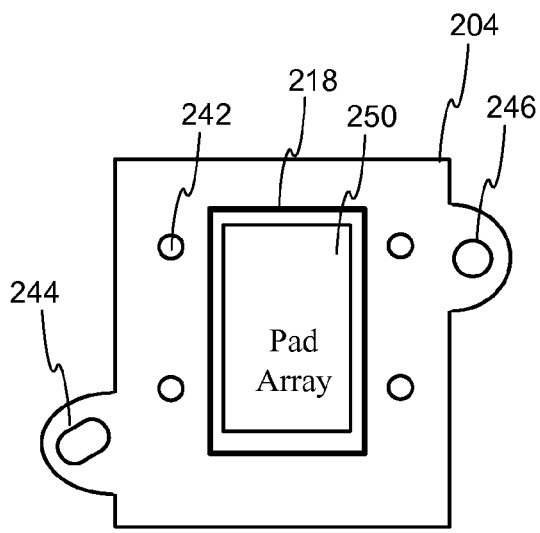

FIG. 2C illustrates an alternative embodiment where there is only one pad array forming spacer-connector 204. However, like the embodiment illustrated in FIG. 2B, there are mounting holes 242 provided and also alignment holes 244 and 246. Since the functionality of the various elements is similar, as detailed in the foregoing description, a detailed discussion will not be provided. However, it will be appreciated that individual spacer-connectors may be arranged in a parallel fashion or may be stacked to provide additional height and/or coupling flexibility.

Figure 4A:
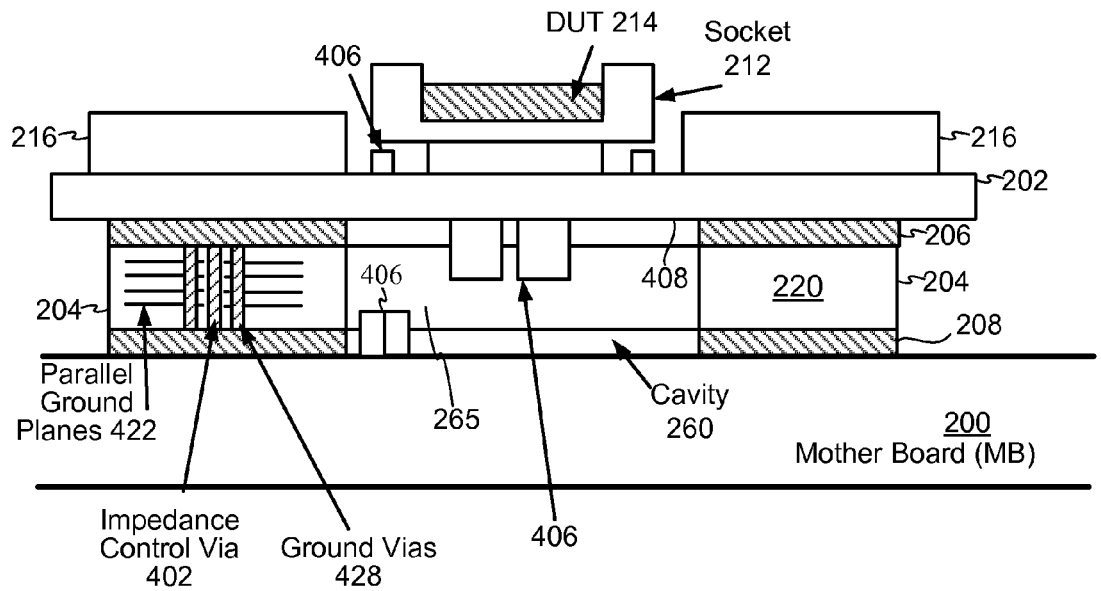
FIG. 4A is a sectional view of an assembly including a socket, a device under test, a daughter board, a dual connector spacer-connector, conductive elastomers, various component locations and a motherboard.

With reference to FIG. 4A, spacer-connector 204 includes a body of material (PCB) 220 having a plurality of signal vias 402 and ground vias 428 and parallel ground planes 422 formed therein coupled to pad arrays on the surface. The body of material 220 may be formed from multiple layers of high performance printed circuit board material, FR4, for example, separated by conductive layers of, for example, copper. The cavity 260 between a pair of connectors/pad arrays of spacer-connector 204 can be produced by milling out a single piece of circuit board. The cavity 260 provides room for RF tuning components 406 and/or other components to be located immediately below the DUT 214, either on the bottom side 408 of daughter board 202 or on the top side of the motherboard 200 allowing for relatively short connections between the tuning elements 406 and the DUT 214. Pressure components 216 (e.g., stiffener blocks) may be provided as discussed above to fasten the assembly and provide a substantially homogeneous pressure across the conductive elastomers 206, 208 and connectors (pad arrays) of spacer-connector 204. It will be appreciated that the thickness of the conductive elastomers 206, 208 is greatly exaggerated and that in most embodiments, there would be no perceptible spacing between the spacer-connector 204 and the daughter board 202 and mother board 200.

The first and second connectors of spacer-connector 204 may be connected to one another by a thin web of material 265 illustrated in FIGS. 2B and 4. This web 265 is provided primarily to maintain a desired separation and registration between the first and second connectors of spacer-connector 204. Additionally, the web material 265 can provide mechanical support to inhibit the center of the daughter board 202 from excessive deflection or "spring boarding." Additionally, the web material 265 can form a barrier to prevent contamination from getting into the spacer cavity 260.

Figure 4B:
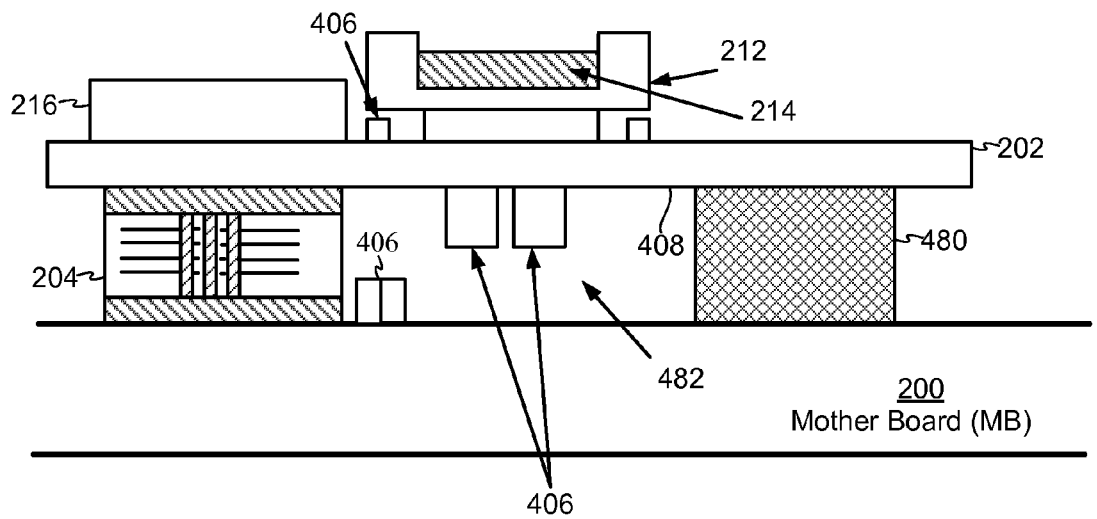
FIG. 4B is a sectional view of an assembly including a socket, a device under test, a daughter board, a single connector spacer-connector, conductive elastomers, various component locations and a motherboard.

FIG. 4B illustrates an alternative configuration where spacer-connector 204 is located on only one side of the DUT 214 and socket 212 assembly and may contain a single pad array portion as illustrated in FIG. 2C, for example. To maintain mechanical stability of the daughter board 202 a separate mechanical spacer 480 may be provided. Additionally, spacer-connector 204 and mechanical spacer 480 will cause an area 482 to be formed under the daughter board 202, which can also be used for mounting components 406. However, the additional mechanical stability and contamination prevention provided by web 265 will not be provided in this arrangement. The remaining elements have been previously described and will not be further described herein for sake of brevity.

In order to connect RF signals to/from DUT 214 and tuning elements 406 on the daughter board 202 with RF components and pathways located on motherboard 200, a wide band RF pathway between the DUT 214 and the motherboard 200 is provided through connector of spacer-connector 204. The pathway through connector of spacer-connector 204 includes impedance controlled vias 402 connected to conductive pads on the surfaces of the connector of spacer-connector 204. As illustrated in FIGS. 5A and 5B, the impedance controlled/signal vias 402 surrounded by a plurality of ground vias 428 to form an RF via arrangement 508. Controlling the number and placement of the ground vias 428 around the signal via 402 maintains tight control of the pathway characteristics such as impedance, return loss, bandwidth, etc. This allows a signal to pass through the connector of spacer-connector 204 in a transparent way. Three ground vias 428 surrounding a signal via 402 are illustrated in FIG. 5A. In FIG. 5B, an alternative RF arrangement 504 is illustrated using five ground vias 428, which may offer improved impedance.

Figures 5C, 5D:
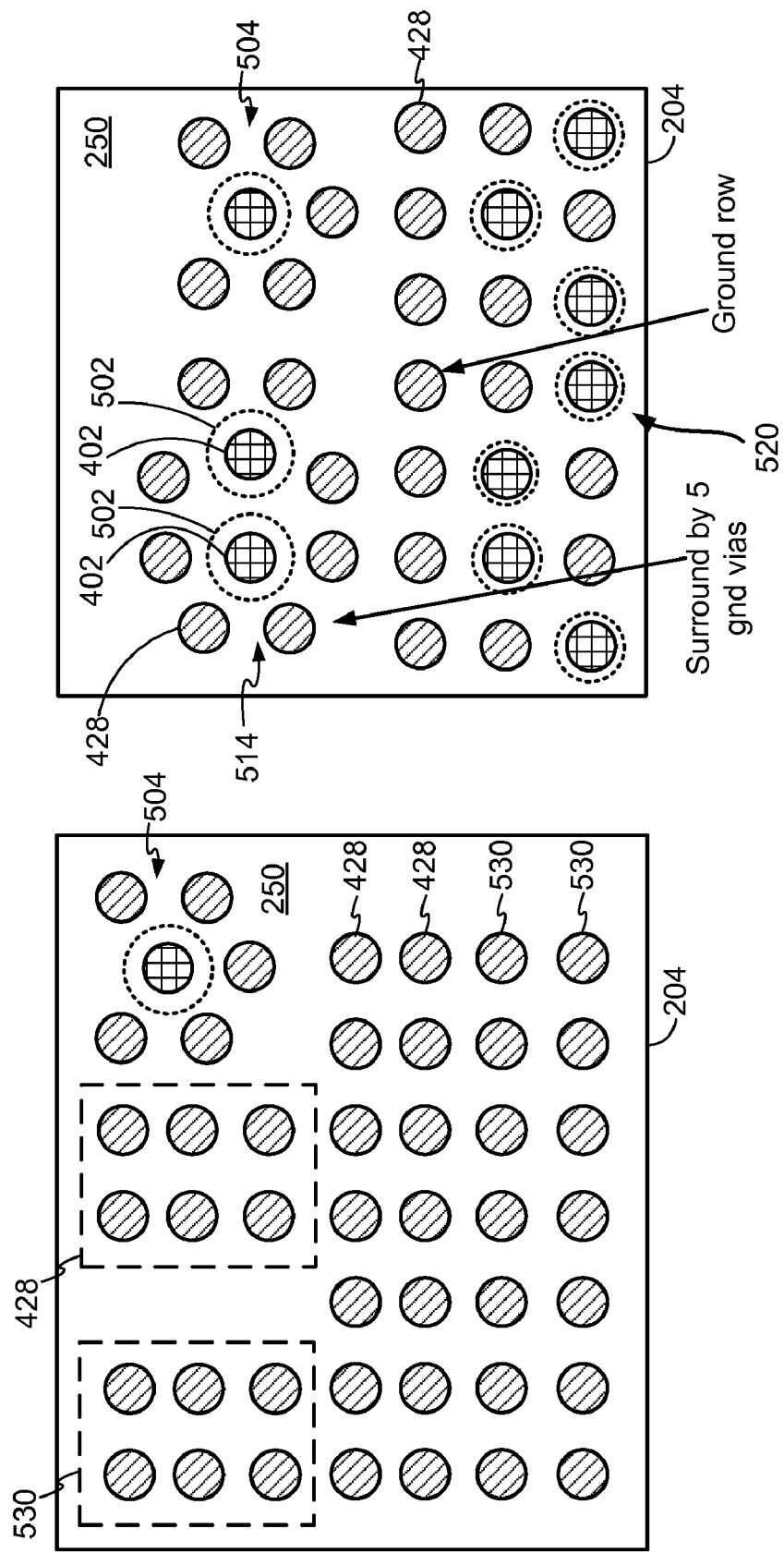

The pads of the pad arrays 250 illustrated in FIGS. 5A-5C may be formed of gold-plated nickel plate on a copper pad. The overall height may be approximately 2.8 mils (0.0028 inches) as that molds more easily into the elastomer and accommodates small variations in co-planarity. Generally, below 1.4 mils there may be less consistent continuity. Above 2.8 mils the pads may cause additional mechanical interference (e.g., with the conductive elastomer) and then continuity may also get worse again. In one embodiment, this can be formed of about 0.0025" of copper, 0.0002" of nickel and then approximately 50 millionth of inches of electroplated gold. However, it will be appreciated that embodiments are not limited to this configuration. Additionally, the pad configurations may be the same for the daughter board and mother board surfaces as well as both sides of the spacer-connector.

The shielding provided by ground vias 428 allows signals of circuits to pass through connector body of spacer-connector 204 without adversely affecting one another. In addition, a portion of the pad array 250 may have a particular arrangement 510 in a ground-signal-ground configuration that can be suitable for intermediate bandwidth digital signals from the DUT 214 to the motherboard 200. The impedance of vias 402 are also affected by the spacing of the ground planes in the body of material 220 (not shown), by via diameter relative to antipad 502 clearance on each ground plane and by the number and physical placement of the surrounding ground vias 428. Accordingly, in view of the foregoing it will be appreciated that using various pad and via combinations, the pad array can be designed for passing signals from DC power to multi-Gigahertz.

Further, in FIG. 5C, a portion or all of a given spacer-connector 204 may be used for power distribution. For example, ground vias/pads 428 can be arranged in rows or grouped in any arbitrary fashion. Likewise, DC power vias/pads 530 can be arranged in rows or grouped in any arbitrary fashion. It will be appreciated that power/low frequency pads 530 will have antipads 502 surrounding them, but the size of the antipads will be small (close to the vias) to preserve routing space and accordingly are not illustrated for clarity of the multi-row arrangement. Generally, it will be appreciated that the size of the antipad will be application specific (e.g., high frequency and/or high voltage having larger spacing and low frequency and/or low voltage having closer spacing). Further, it will also be appreciated that the ground and/or power pad/vias may be further arranged to provide additional isolation to a critical high frequency signals (e.g., 504).

FIG. 5D illustrates another pad/via arrangement for spacer-connector 204. This configuration is similar to that of FIG. 5B, but also includes impedance controlled conductive vias 402 configured as a fully differential via set 514. In addition, pads/vias arrangement 520 in a ground/signal/signal/ground configuration is also illustrated, which is suitable for intermediate bandwidth.

The arrangement and number of ground vias shown are for illustration purposes and may be subject to application specific requirements such as pathway impedance or bandwidth for example. In practice, the arrangement/number of ground vias may be virtually unlimited for which the flexibility of spacer-connector 204 is well suited. Accordingly, it will be appreciated that spacer-connector 204 includes a configurable pad array that is configured to pass signals between the daughter board 202 to the mother board 200. The pad array is configurable in the sense that the arrangements of the various contact configurations (see, e.g., FIGS. 5A-5D) and vias are easily configured using conventional PCB manufacturing techniques. For example, the various ground and DC power vias may be located at the pad array periphery and/or may be used as signal-type segregators to provide isolation. Pad-types providing low frequency or control functions may be placed tightly spaced within the pad array with ground return pads not located immediately adjacent. For many hundreds of megahertz capable signaling, pad/via-arrays may be placed in a variety of ground/signal/ground (GSG) type patterns (e.g. GSG, GSSG, etc). Ultra wideband/very high frequency signals (multi gigahertz) may utilize pad array groupings to emulate coaxial line coupling through the spacer-connector 204. Pad arrangements may include, for example, a signal pad surrounded by two, three, or more ground pads to establish a finite well controlled transmission line impedance and ultra-low return loss characteristics.

Figure 6:
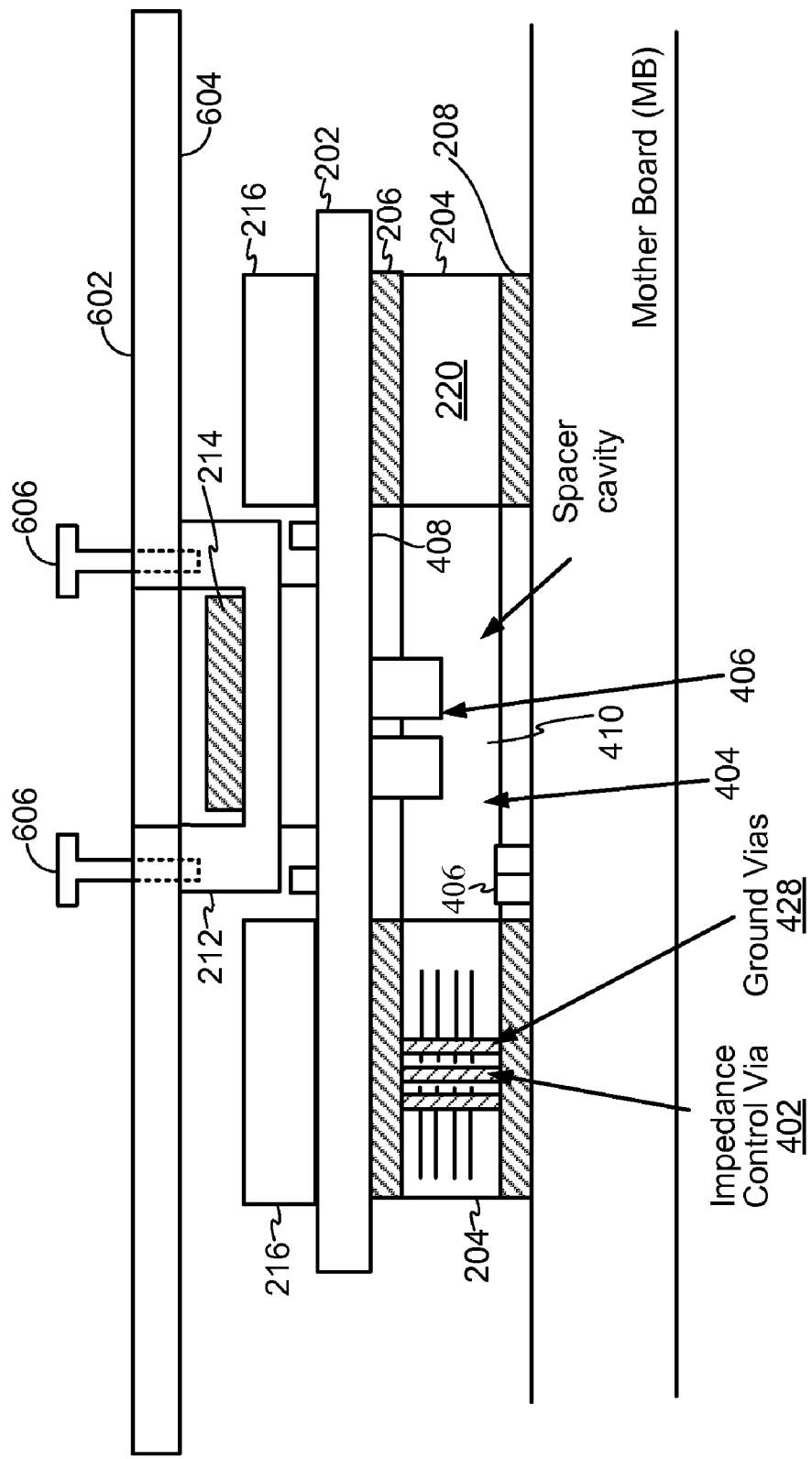
FIG. 6 is a side elevation view of an assembly including a socket, a device under test, a daughter board, a spacer-connector, a motherboard and a handler alignment plate.

The presence of the first and second conductive elastomers 206, 208 can affect the height of the socket 212 relative to an automated apparatus (not illustrated) for inserting devices into the socket 212. The height of the socket 212 can vary to a greater extent when a plurality of the sockets 212 is supported between a pair of connectors of spacer-connector 204. In order to keep the top of the socket or sockets 212 at a desired level, an alignment plate 602, illustrated in FIG. 6, may be used. The alignment plate 602 is rigid and is fixed to a support (not illustrated) such that the bottom surface 604 of the alignment plate 602 is at a known height relative to the desired location of the socket 212. Threaded fasteners 606 are inserted through the alignment plate 602 into openings on the top of the socket 212 and tightened to draw the socket 212 toward the bottom surface 604 of the alignment plate 602 until the top surface of the socket 212 contacts the bottom surface 604 of the alignment plate 602. In this manner, the top surfaces of one or more sockets 212 on a daughter board 202 can be maintained in a desired position to allow the proper automatic insertion of devices such as DUT 214.

Figure 7:
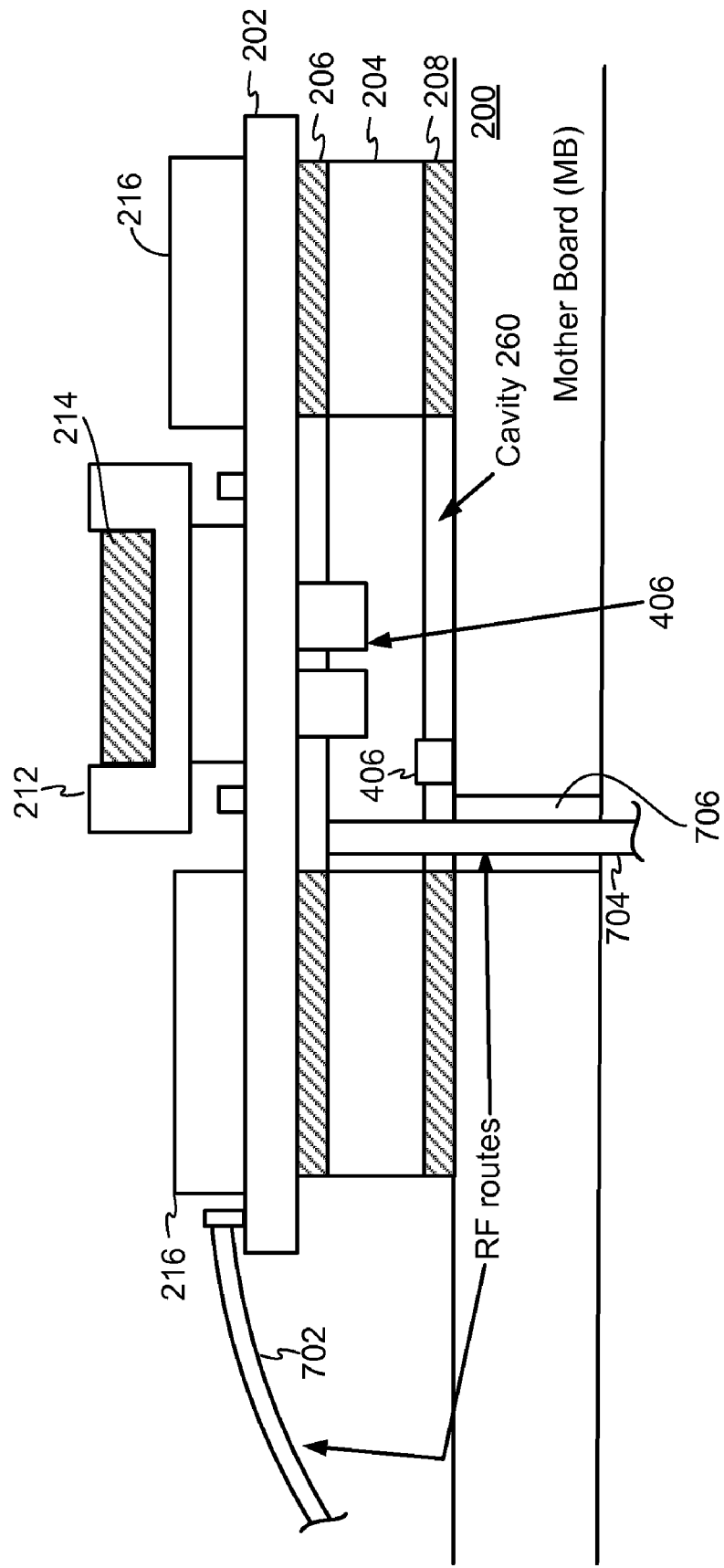
FIG. 7 is a sectional view of an assembly including a socket, a device under test, a daughter board, a connector, coaxial cable connections and a motherboard.

A variety of RF connections can be made when using one or more connectors of spacer-connector 204 to elevate a daughter board 202 above a motherboard 200. As illustrated in FIG. 7, coaxial cables 702 may be used to connect elements (RF, analog, high speed digital) on the top side of the daughter board 202 to ATE test channels, test hardware or data acquisition systems (not illustrated) while allowing the tuning components 406 to be located near the DUT 214 on the underside of the daughter board 202 and/or on the motherboard 200 in the region between the daughter board 202 and the motherboard 200. When a large number of RF connections with a DUT 214 are required, it may also be possible to route additional coaxial leads 704 in cavity 260 to the underside of the daughter board 202 and through openings 706 in the motherboard 200 so that fewer coaxial cables need to be routed from the top side of the daughter board 202.

While a mother board and daughter board have been described, those of skill in the art will appreciate that embodiments disclosed herein could likewise be used in other electronic hardware. Further, the spacer-connector assemblies disclosed herein can be used to interface between any type of electrical hardware having a pad array and are not limited to a test environment or to coupling signals for devices under test.

While the foregoing disclosure has generally discussed embodiments having relatively straight through coupling of signals from pads on a first side through the vias to corresponding pads on a second side. However, the various embodiments contemplated are not limited to these configurations. For example, referring to FIG. 8, it will be appreciated that the multi-layer PCB construction allows for both the straight through vias such as 402 and 428, but also allows for internal routing of signals. For example, blind via 430 can be coupled by an internal connection 431 to a buried via 432, which is coupled by another internal connection 433 to blind vias 434 and 436. Accordingly, it will be appreciated that the correspondence between pads on the first side may be changed both in geometry (e.g., located in different relative positions) and number (e.g., one pad to two or more pads). Still further, it is possible to have capacitive and/or inductive AC coupling in the spacer-connector by controlling the adjacent positioning of vias and/or pads and/or conductors which can be achieved using the multi-layer PCB construction.

Figure 8:
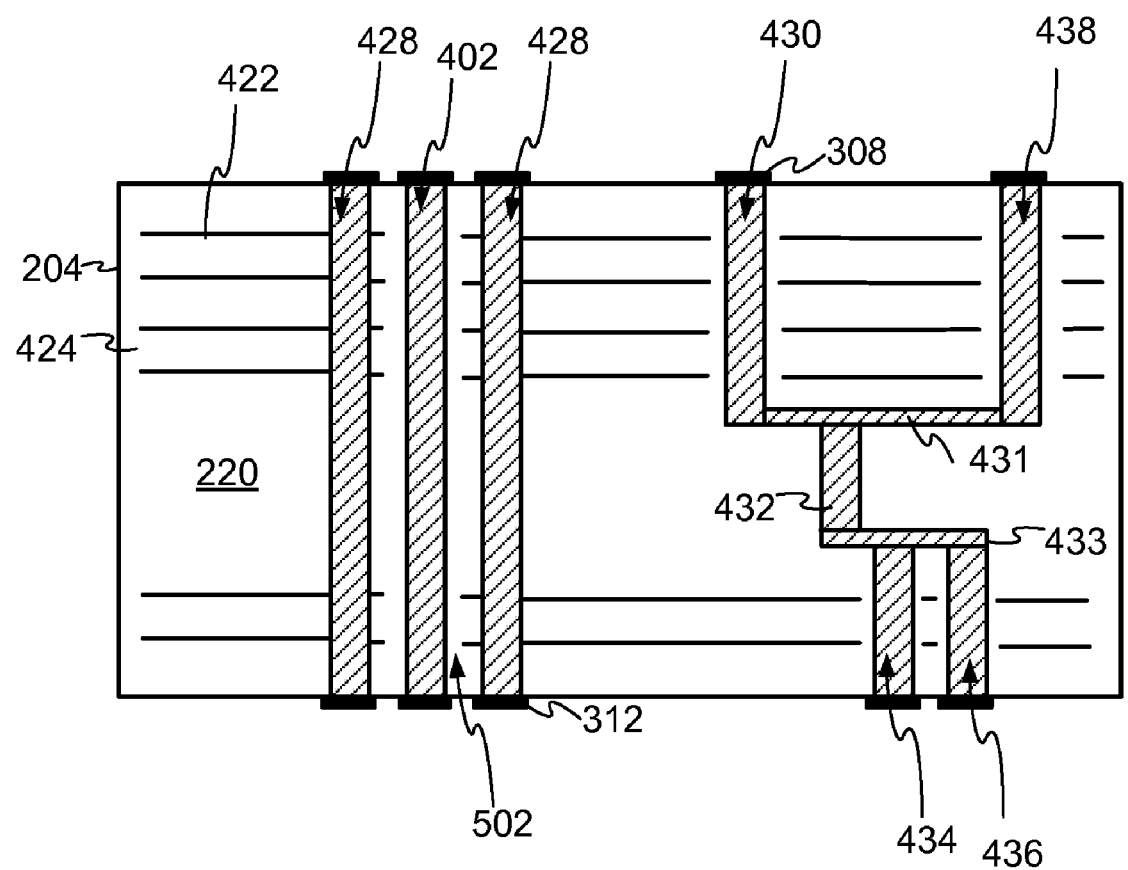
FIG. 8 illustrates a sectional view of a spacer-connector formed from a multilayered PCB having a plurality of ground planes and conductive vias.

FIG. 8 also illustrates a sectional view of a multilayered PCB having a plurality of ground planes 422 separated by layers of dielectric material 424. Further, additional conductive planes/traces may be included internally (e.g., 432, 433) separated by dielectric layers for routing signals internally. Conductive ground vias 428 and signal vias 402, 432 can run substantially perpendicular to the ground planes 422. Each via is connected to contact pads (308, 312) affixed to it at each PCB surface. The ground vias 428 can be coupled to the ground planes, whereas the signal vias 402, 432 may have antipads 502 formed in each ground plane. This arrangement provides for coaxial-type performance to contain the electrical fields of the signal vias 402. Further it will be appreciated that in various embodiments a first contact pad may be coupled to a conductive via that may extend only partially through the PCB (e.g., 432, 434, and 436) to an internal connection point (e.g., 431, 433) and may be routed from there to one or more conductive vias (e.g., 434, 436) that couple to one or more pads that may be physically offset from the first contact pad (430). Accordingly, embodiments include configurations where the coupled contact pads on either side of the spacer-connector 204, may be physically offset from each other. Further, it will be appreciated that using similar internal connections (e.g., 431), the signal can be routed back to the same surface it originated, such as provided by via 438. It will be appreciated that the illustrated arrangements are not intended to limit the various embodiments and that the spacer-connector disclosed herein allows for various arrangements to be designed to accommodate a variety of interfaces.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The foregoing disclosed devices and methods may be designed and configured into GDSII and GERBER computer files, stored on a computer readable media. These files are in turn provided to fabrication handlers who fabricate devices based on these files.

Accordingly, embodiments can include machine-readable media or computer-readable media embodying instructions which when executed by a processor transform the processor and any other cooperating elements into a machine for fabricating the embodiments described herein as provided for by the instructions.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A circuit board assembly comprising:
a spacer-connector assembly positioned between a first circuit board and a second circuit board, wherein the spacer-connector assembly comprises:
a spacer-connector formed of a multilayer printed circuit board (PCB) having a configurable pad array that is configured to pass signals between the first circuit board and the second circuit board, wherein the pad array is formed from the surface conductive layer of the PCB; and
an elastomeric conductive interface positioned between the pad array of at least one of the spacer-connector and the first circuit board or the spacer-connector and the second circuit board; and
a pressure component configured to provide a homogeneous pressure across the elastomeric conductive interface of the spacer-connector assembly, wherein the spacer-connector includes multiple parallel ground planes and impedance controlled conductive vias.

2. The circuit board assembly of claim 1, wherein the elastomeric conductive interface is formed of a material that is conductive under a characteristic pressure.

3. The circuit board assembly of claim 2, wherein the characteristic pressure is a range of pressures for a given material.

4. The circuit board assembly of claim 2, wherein the elastomeric conductive interface is at least one of a spray-on material, a conductive sheet or a high density compressible material that becomes conductive in vertical paths under pressure.

5. The circuit board assembly of claim 1, wherein the impedance controlled conductive vias each comprise a conductive via adjacent to a plurality of ground vias.

6. The circuit board assembly of claim 5, wherein impedance controlled conductive vias includes at least one fully differential via set.

7. The circuit board assembly of claim 1, wherein the pad array is formed of pads on a top and bottom surface of the PCB coupled to conductive vias formed through the PCB.

8. The circuit board assembly of claim 1, wherein the pressure component comprises:
a stiffener block located over the spacer-connector and coupled to the first circuit board and the second circuit board provide the homogeneous pressure.

9. The circuit board assembly of claim 8, wherein the stiffener block is formed of metal with a surface contacting the first circuit board being insulated.

10. The circuit board assembly of claim 8, wherein the stiffener block is coupled to the first circuit board and the second circuit board via a resilient fastener system.

11. The circuit board assembly of claim 1, wherein the pressure component includes a metal insert grounded to provide electrical shielding and reduce induced current.

12. The circuit board assembly of claim 1, wherein the pressure component is a resilient fastener system directly applied to the first circuit board to fasten the first circuit board to the second circuit board and compress the spacer-connector assembly in between with a relatively constant pressure.

13. The circuit board assembly of claim 1, wherein the first circuit board is a daughter board coupled to a device under test, and wherein the second circuit board is a mother board.

14. A circuit board assembly comprising:
a spacer-connector assembly positioned between a first circuit board and a second circuit board, wherein the spacer-connector assembly comprises:
a spacer-connector formed of a multilayer printed circuit board (PCB) having a configurable pad array that is configured to pass signals between the first circuit board and the second circuit board, wherein the pad array is formed from the surface conductive layer of the PCB; and
an elastomeric conductive interface positioned between the pad array of at least one of the spacer-connector and the first circuit board or the spacer-connector and the second circuit board; and
a pressure component configured to provide a homogeneous pressure across the elastomeric conductive interface of the spacer-connector assembly, wherein the pad array is formed of pads on a top and bottom surface of the PCB coupled to conductive vias formed through the PCB, and
wherein pad array comprises pads coupled to impedance controlled conductive vias, conductive vias and ground vias.

15. The circuit board assembly of claim 14, wherein at least a portion of the pad array is arranged in at least one of a ground/signal/ground arrangement or ground/signal/signal/ground arrangement.

16. A circuit board assembly comprising:
a spacer-connector assembly positioned between a first circuit board and a second circuit board, wherein the spacer-connector assembly comprises:
a spacer-connector formed of a multilayer printed circuit board (PCB) having a configurable pad array that is configured to pass signals between the first circuit board and the second circuit board, wherein the pad array is formed from the surface conductive layer of the PCB; and
an elastomeric conductive interface positioned between the pad array of at least one of the spacer-connector and the first circuit board or the spacer-connector and the second circuit board; and
a pressure component configured to provide a homogeneous pressure across the elastomeric conductive interface of the spacer-connector assembly,
wherein the first circuit board is a daughter board coupled to a device under test, and wherein the second circuit board is a mother board and
wherein the spacer-connector has a second pad array and wherein the two pad arrays are positioned toward opposite ends of the daughter board to form a cavity below a portion of the daughter board coupled to the device under test.

17. The circuit board assembly of claim 16, further comprising:
at least one electrical component positioned in the cavity.

18. The circuit board assembly of claim 17, wherein the at least one electrical component is a radio frequency (RF) tuning component coupled to at least one of the daughter board or the mother board.

19. The circuit board assembly of claim 16, further comprising:
a cable connection coupled to a portion of the daughter board in the cavity.

* * * * *